United States Patent [19]
Doll

[11] Patent Number: 5,550,762
[45] Date of Patent: Aug. 27, 1996

[54] DIAGNOSTIC SYSTEM FOR ELECTRONIC AUTOMOTIVE SYSTEM

[76] Inventor: John A. Doll, 7304 Greenlawn, Louisville, Ky. 40222

[21] Appl. No.: 505,597

[22] Filed: Jul. 21, 1995

Related U.S. Application Data

[63] Continuation of Ser. No. 169,171, Dec. 20, 1993, abandoned.

[51] Int. Cl.$^6$ .................................................. G05B 15/00
[52] U.S. Cl. ............... 364/579; 364/424.03; 364/551.01; 371/25.1
[58] Field of Search ............................ 371/25.1, 26, 27, 371/29.1; 364/424.03, 424.04, 578, 579, 580, 551.01

[56] References Cited

U.S. PATENT DOCUMENTS

| | | | |
|---|---|---|---|
| 4,817,418 | 4/1989 | Asami et al. | 371/29 |
| 4,821,266 | 4/1989 | Ohm et al. | 371/16 |
| 4,831,560 | 5/1989 | Zaleski | 364/551.01 |
| 4,843,557 | 6/1989 | Ina et al. | 371/29 |
| 4,862,371 | 8/1989 | Maekawa | 364/551.01 |
| 4,967,143 | 10/1990 | Raviglione et al. | 324/73.1 |
| 5,043,984 | 8/1991 | Tomisawa et al. | 371/25.1 |
| 5,107,428 | 4/1992 | Bethencourt et al. | 364/424.04 |
| 5,214,582 | 5/1993 | Gray | 364/424.03 |
| 5,307,290 | 4/1994 | Raviglione et al. | 364/551.01 |
| 5,313,388 | 5/1994 | Cortis | 364/424.04 |

Primary Examiner—Emanuel T. Voeltz
Assistant Examiner—Kyle J. Choi

[57] ABSTRACT

A device for quickly and accurately testing an electronic vehicle engine control module having a simulated signal generator for supplying simulated or "dummy" input signals to the module under test. These simulated signals correspond to signals normally generated by peripheral automotive components such as mass air flow sensors, throttle position sensors, oxygen sensors, and the like, in proper working order. A simulation program controls the simulated signal generator and causes the simulated signal generator to generate predetermined signals appropriate to the design of the module and specific to the simulated operating conditions under which the module is being tested. The simulation program also contains acceptable ranges of output values (that should be produced by a property operating module) corresponding to the simulated operating conditions defined by the simulation program. An output signal reader receives the various output signals produced by the module under test (based upon the simulated signals fed to it) then conditions and organizes those output signals for analysis. An output evaluator receives the output signals gathered by the output signal reader and compares them to the acceptable ranges of output valves supplied by the simulation program. A diagnostic output means associated with the output evaluator displays to the repair technician any faults in the module detected by the output evaluator.

23 Claims, 3 Drawing Sheets

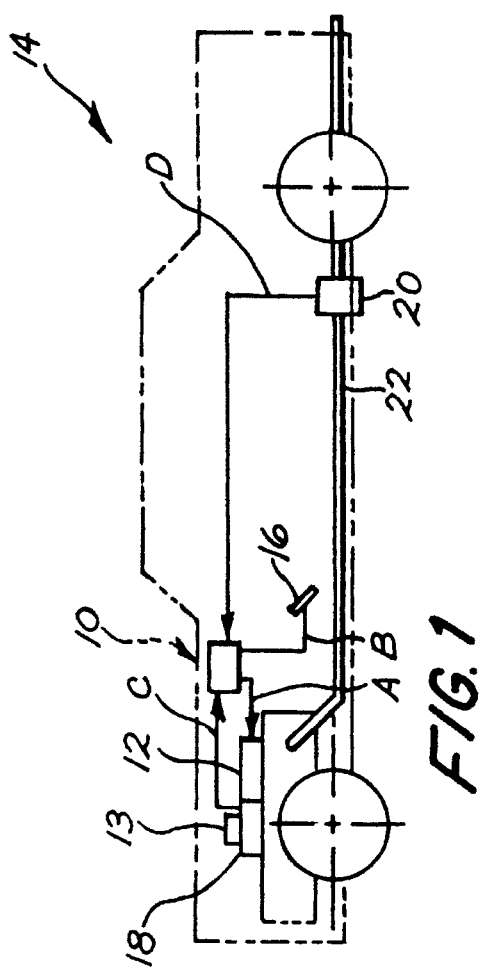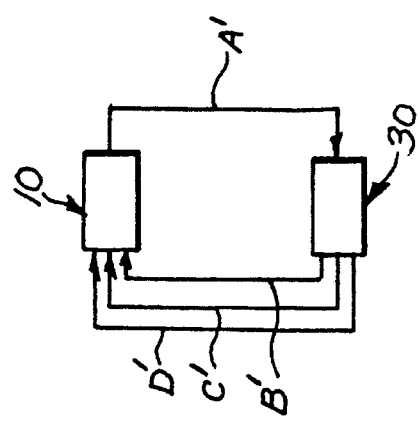

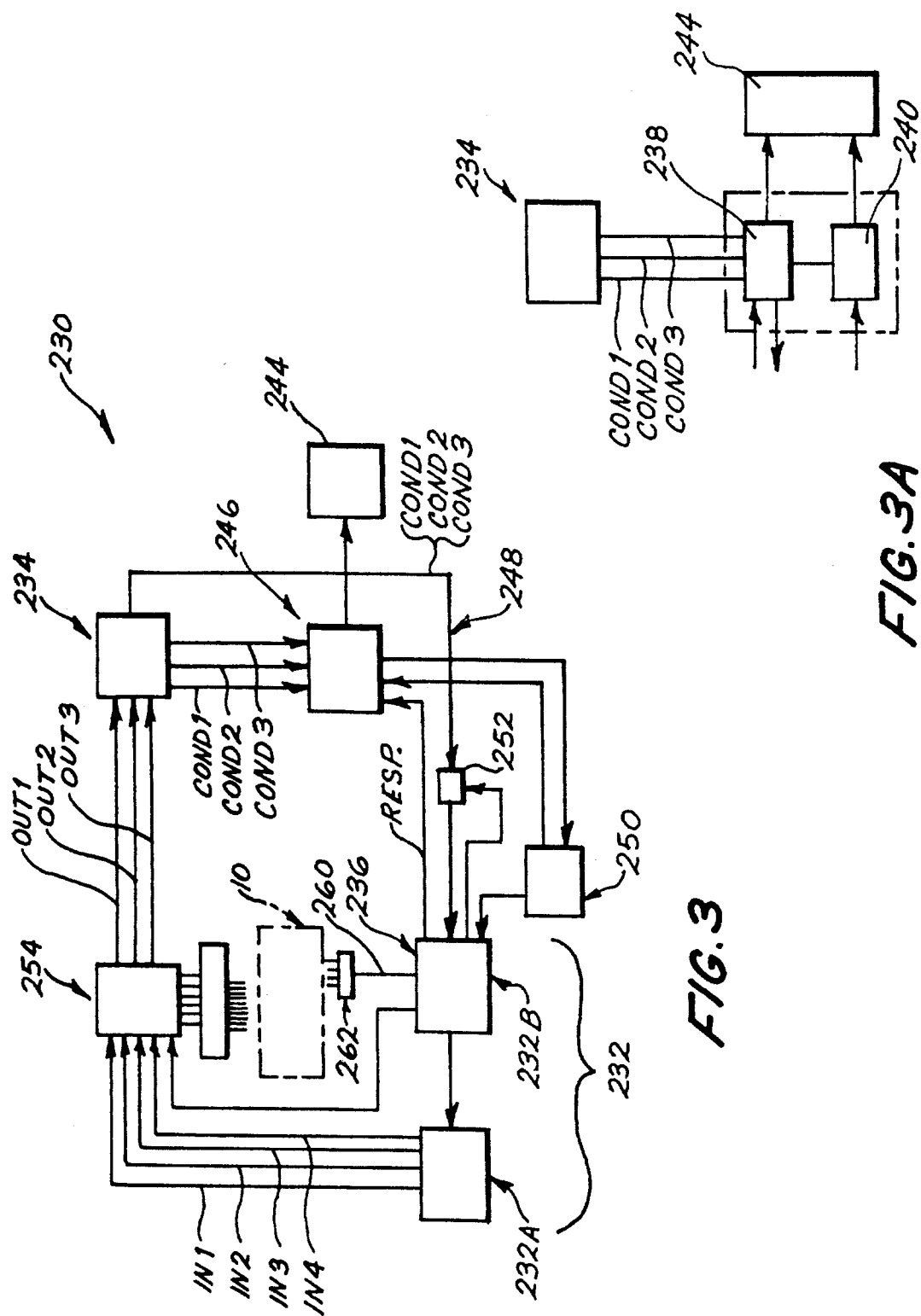

5,550,762

DIAGNOSTIC SYSTEM FOR ELECTRONIC AUTOMOTIVE SYSTEM

This is a continuation of application Ser. No. 07/169,171, filed on Dec. 20, 1993, now abandoned.

BACKGROUND OF THE INVENTION

1. Field of the Invention

The present invention relates to electronic testing equipment and methods, and more particularly to testing equipment to be used for diagnosing electronic automotive system faults.

2. Description of the Prior Art

With increasing use and complexity of electronics in automotive applications, expedient and accurate diagnosis of electronic automotive electronic system's faults has become difficult, and in some cases impossible. Traditionally, the training of automotive repair personnel emphasizes the understanding of mechanical technology, making the 'troubleshooting' of electronic automotive systems a somewhat daunting and alien prospect to a traditionally trained automotive repair technician. Also, because of the constant and rapid evolution of automotive electronics, knowledge and equipment used to diagnose electronic automotive systems quickly become obsolete making the task of updating testing and diagnostic equipment and retraining personnel difficult and expensive. Further, due to the interactions between components in electronic automotive systems, it is often difficult to 'pinpoint' the problem to a specific electronic components. An ignition computer unit, for example, may appear to malfunction when, in fact, a broken sensor is supplying the computer with false information. Often, because of the above-mentioned problems, the repair technician resorts to the slow, costly plan of almost arbitrarily replacing components and observing the effect of the replacement on the automobile in an attempt to isolate the malfunctioning component. This method, in addition to costliness in time and money, has proven to be inaccurate as it has been empirically found that a significant portion of those automotive electronic components (especially engine control computers) submitted for repair are, in fact, functionally sound with the original problem being elsewhere.

Various electronic systems have been devised to aid in the diagnosis of automotive electronic faults. These testing/diagnostic systems, however, suffer from a number of drawbacks which seriously diminish their effectiveness. Many of these testing/diagnostic systems test automotive electronics through a purpose-built diagnosis data interface installed in the electronic automotive system. The problem with this, of course, is that the diagnostic data interface may, itself, be malfunctioning, may be involved in the malfunction, or may be fooled by erroneous data received from components peripheral to the electronic automotive system under test.

Other testing/diagnostic systems bypass the purpose-built diagnostic data interface and directly read the functional outputs (a functional output being those outputs used to control peripheral components that have a direct effect on the performance of the automobile) of the electronic automotive system being tested. Although this method prevents misdiagnosis due to malfunction of the diagnostic interface, misdiagnosis is possible (and, as practical experience has proven, is common) because the electronic automotive system under test is reacting appropriately to erroneous information from peripheral components.

Also, a fault in the electronic automotive system may be intermittent or be particular to certain operating conditions and appear intermittently. Many of the known electronic testing/diagnostic systems are designed to work in the automotive repair shop (where operating conditions rarely change a significant amount) and, therefore, cannot test the automotive electronics under a variety of operating conditions This "static" or steady-state, testing of the electronic automotive system will tend to entirely miss condition-dependent faults in the automobile's electronics. Other testing/diagnostic systems, in an attempt to facilitate the diagnosis of condition-dependant faults, are physically small and are designed to be used while the car is in motion and actually experiencing varying driving conditions. Although this method seems to be an improvement over "static" testing, it leaves much to be desired. This "driving" test method is inconvenient in that the automotive repair technician has to actually drive the automobile until the fault appears, wasting time and fuel. Also, it may be difficult, undesirable, or dangerous to expose the automobile to extreme operating conditions in order to find an electronic fault with the "driving" test method.

As has been discussed, currently used electronic testing/diagnostic systems tend to be inaccurate and inconvenient to use and often wind up unused in the corner of the repair garage.

SUMMARY OF THE INVENTION

The object of the present invention is to provide a quick, convenient, and above-all, accurate system and method for diagnosing an electronic automotive system (such as an electronic ignition computer or an electronic fuel-injection control, for example) while avoiding the common problem of misdiagnosis due to malfunctioning interrelated automotive components effecting the performance of the electronic automotive system under test. The method of the present invention accomplishes diagnostic testing of the electronic automotive system in question by creating a virtual computer model of a perfectly functioning automobile (the term automobile could, of course, be referring to an automobile, a truck, a motorcycle, or other form of mechanized transport) of a design in which the electronic automotive system under test is to operate. This virtual model has the advantage of isolating the electronic automotive system under test from any other automotive components so that malfunctioning peripheral automotive components cannot effect the performance of the electronic automotive system under test. Further, with the diagnostic system of the present invention, it is possible to test the automotive electronic system of the automobile. This also allows a new or repaired automotive electronic system to be tested before installation in an automobile saving the time and expense of installing the electronic system in an automobile in the event the electronic system is defective. Also, with the virtual model created by the diagnostic system of the inventor, it becomes quite simple to test an electronic automotive system under very specific sets of operating conditions which may be difficult or impossible to physically duplicate by operating an actual automobile. With the virtual model method of the present invention, it is also possible to intentionally introduce simulated malfunctions in the virtual model in order to observe the reaction of the electronic automotive system under test and, thusly, gain insight into the operation of the electronic automotive system under test. A practical example of such a malfunction simulation procedure to test an electronic automotive system, such as an electronic fuel injection control, for example, would be to generate a simulated signal corresponding to a malfunctioning peripheral component (such as an oxygen sensor) and to observe the behavior of the electronic fuel injection control as it reacts to the simulated signal from the "malfunctioning component".

More particularly, the present invention provides a method for electronically diagnosing an electronic automotive system normally operatively associated with and controlling peripheral automotive components comprising generating simulated stimulus input signals to the electronic automotive system corresponding to actual stimulus signals normally received by the electronic automotive system from the peripheral components and causing the electronic automotive system to generate output response signals based upon the simulated stimulus input signals, conditioning the output response signals from the electronic automotive system for data processing and generating conditioned output response signals, generating exemplar response data signals responsive to the simulated stimulus input signals, comparing each of the conditioned output response signals to the exemplar response signals, evaluating differences between the conditioned output response signals and the exemplar response signals, and, if there is a difference between the conditioned output response signals and the exemplar response signals, then generating corresponding fault evaluation signals identifying faults in the electronic automotive system; and displaying the fault evaluation signal.

The present invention further provides a diagnostic system for electronically diagnosing an electronic automotive system having a plurality of inputs to be operatively associated with a plurality of peripheral automotive components for receiving operating condition data from the peripheral components and a plurality of outputs to be operatively associated with a plurality of peripheral components for controlling the peripheral components, the diagnostic system comprising means for generating a plurality of simulated stimulus input signals to the electronic automotive system corresponding to actual stimulus signals normally received by the electronic automotive system from the peripheral components and causing the electronic automotive system to generate output response signals based upon the simulated stimulus input signals, means for conditioning the output response signals from the electronic automotive system for data processing and generating conditioned output signals, means for generating exemplar response data signals responsive to the simulated stimulus input signals, means for comparing each of the conditioned output response signals to the exemplar response signals, means for evaluating differences between the conditioned output response signals and the exemplar response data signals, means for generating fault evaluation signals identifying faults in the electronic automotive system corresponding to a difference between the conditioned output response signals and the exemplar response signals, and, means for displaying the fault evaluation signal generated by the fault evaluation signal generating means.

BRIEF DESCRIPTION OF THE DRAWINGS

A better understanding of the present invention will be had upon reference to the following discussion and the accompanying drawings, wherein like numerals refer to like components:

FIG. 1A is an illustration of an example electronic automotive system installed in its associated automobile;

FIG. 1B is the example electronic automotive system removed from its associated automobile and operatively attached to the testing/diagnostic system of the present invention;

FIG. 3 is a schematic illustration of yet another embodiment of the present invention; and FIG. 3A is an enlarged view of a component of the embodiment of FIG. 3.

DETAILED DESCRIPTION OF THE PREFERRED EMBODIMENTS

Figure 2:
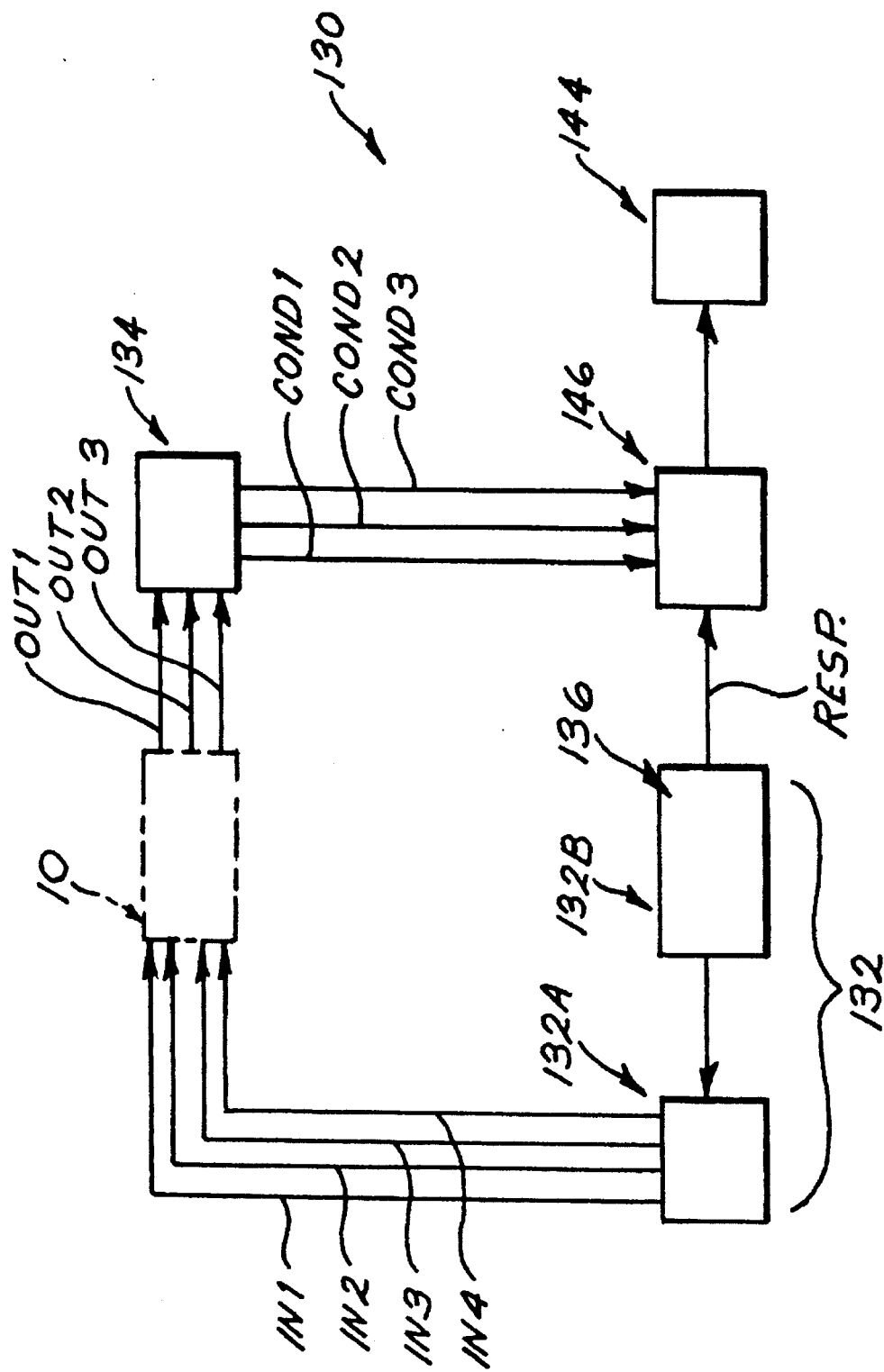
FIG. 2 is a schematic illustration of another embodiment of the present invention.

With reference to FIG. 1A, there is shown an example of an electronic automotive system 10 for controlling the rate of fuel injected by the injectors 12 of an electronically controlled fuel induction system 13 of an automobile 14 by use of an injection control signal A generated by the electronic automotive system 10. The electronic automotive system 10 gains information on the operating conditions of the automobile 14 from various sensors. The accelerator pedal 16 sends an accelerator pedal position signal B to the electronic automotive system 10 corresponding to how far the accelerator pedal 16 is depressed by the driver (and how much power output is being asked of the automobile 14). A mass air flow sensor 18 sends a mass air flow signal C to the electronic automotive system 10 corresponding to the amount, in terms of mass, of air flowing into the engine of the automobile 14. An oxygen sensor 20 installed in the exhaust gas conduit 22 sends an oxygen signal D to the electronic automotive system 10 corresponding to the amount of oxygen present in the exhaust gases. The electronic automotive system 10 takes the above-mentioned signals B, C, and D as input; performs internal calculations based on the values represented by these signals B, C, and D; and outputs the injection control signal A which controls the injection rate of the injectors 12.

In normal operation, the electronic automotive system 10 interacts with the accelerator pedal 16, the mass air flow sensor 18, and the oxygen sensor 20, and controls the injectors 12 in a manner appropriate to the operating conditions reported to the automotive electronic system 10 by the peripheral components 16, 18 and 20. Under normal operation, the mass air flow sensor 18 sends a mass air flow signal C to the electronic automotive system 10 which provides a means of feedback as to the amount of air passing through the induction system 13 of the automobile 14. This feedback from the mass airflow sensor 18 allows the electronic automotive system 10 to make adjustments to the injection rate of the injectors 12 to compensate for variations in air flow due to variations in air density, etc. The oxygen sensor 20 sends an oxygen signal D to the electronic automotive system 10 which provides a means of feedback as to the content of oxygen in the exhaust gases which is used by the electronic automotive system 10 to determine the present combustion efficiency of the automobile. This feedback from the oxygen sensor 20 allows the electronic automotive system 10 to make adjustments to the fuel injection rate of the injectors 12 to compensate for various combustion conditions due to varying engine temperature, fuel formulation, etc.

If a malfunction occurs in a component peripheral to the electronic system 10, such as the oxygen sensor 20, for example, the behavior of the electronic automotive system 10 will be effected even though the electronic automotive system 10, itself, is functioning correctly. In the specific example of an oxygen sensor 20 malfunction, wherein the oxygen signal D continuously represents zero exhaust oxygen, the behavior of the electronic automotive system 10 will be drastically effected.

As the driver depresses the accelerator pedal 16, the accelerator pedal 16 sends an accelerator pedal position signal B to the electronic automotive system 10. The electronic automotive system 10, reacting to the accelerator pedal position signal B, sends an injector control signal A which causes the injectors 12 to increase the rate of fuel injection (in response to greater airflow due to a new throttle position). Since the oxygen sensor 20 has failed, proper exhaust oxygen content does not register and the oxygen sensor 20 continues to send an oxygen signal D to the electronic automotive system 10 corresponding to zero exhaust oxygen. Upon receiving the erroneous zero oxygen signal D from the malfunctioning oxygen sensor 20, and considering the power demand based on the accelerator pedal position signal B, the electronic automotive system 10 assumes there is an over-rich fuel/air ratio and mistakenly sends an injector control signal A to reduce the fuel injection rate of the injectors 12. Because the oxygen sensor 20 has malfunctioned, even this revised fuel injection rate is represented to the electronic automotive system 10 as over-rich, causing the electronic automotive system 10 to reduce the injection rate of the fuel injectors 12 still further creating a feedback condition in which the injection rate of the injectors 12 is at a minimum at all times.

This malfuncting oxygen sensor 20 may be difficult for a repair technician to diagnose, for it initially appears that the electronic automotive system 10, itself, is malfunctioning and sending a constant "reduce injection rate" injector control signal A. Only after the electronic automotive system 10 is replaced (at great cost) and the problem persists may the repair technician suspect a faulty peripheral component (such as a sensor). The hunt for the unidentified, malfunctioning peripheral component sensor then begins at substantial cost in time.

With reference to FIG. 1B, there is shown the electronic automotive system 10 of FIG. 1A removed from its associated automobile 14 and connected to a diagnostic system 30 of the present invention. When a repair technician suspects that the electronic automotive system 10 is malfunctioning (due to some anomalous behavior) the electronic automotive system 10 is removed from the automobile 14 and connected to the diagnostic system 30. The diagnostic system 30 supplies the electronic automotive system 10 with a simulated accelerator pedal position signal B', a simulated mass airflow signal C', and a simulated oxygen signal D', each corresponding to an actual proper signal that would be produced by an analogous peripheral component in normal operation. The electronic automotive system 10 under test then reacts to the simulated signals received from the diagnostic system 30 as if it were connected to the actual peripheral components, installed in an actual automobile producing the signals B', C', D' and produces an injector control signal A in accordance with the simulated signals B', C', D'. The injector control signal A is read by the diagnostic system 30 and compared to a stored, predefined range of acceptable values into which the injector control signal A must fall for proper operation. If the injector control signal A falls within the predefined range of acceptable values, then the diagnostic system 30 evaluates the electronic automotive system 10 under test as functioning properly. If the injector control signal A falls outside the predefined range of acceptable values, then the diagnostic system 30 evaluates the electronic automotive system 10 under test as malfunctioning. The evaluation results created by the diagnostic system 30 can be stored or "polled" and added to a data bank containing statistical information about the particular model of the electronic automotive system 10 being tested to allow further statistical evaluation of various faults in the electronic automotive system 10.

Further, even if the electronic automotive system 10 under test is found to be functionally sound, the diagnostic system 30 can aid in proper diagnosis. This can be done by altering the simulated signals B', C', D' to mimic signals that are indicative of faulty peripheral components. This will give the repair technician insight as to the behavior of a properly functioning electronic automotive system 10 connected to at least one malfunctioning peripheral component. In the specific case of a failed oxygen sensor 20, as in the example of FIG. 1A, (after determining with the diagnostic system 30 that the electronic system 10 is, itself, functioning correctly), the diagnostic system 10 is set to produce or simulate an oxygen signal D' that corresponds to a failed oxygen sensor 20 showing zero exhaust oxygen, and a simulated properly functioning accelerator pedal position signal B', and a simulated properly functioning mass airflow sensor signal C'.

The properly functioning electronic system 10 is allowed to react to the simulated peripheral component signals B', C', D'. Since the electronic system 10 reads zero exhaust oxygen from the oxygen signal D', the electronic system 10 reacts by creating an injector control signal A to reduce the rate of injection by the injectors 12. The injector control signal A is sent to the diagnostic system 30 which displays to the repair technician, the current state of the injector control signal A. The injector control signal A is then used by the diagnostic system 30 to alter the simulated peripheral component signals B', C', D' as if the injector control signal A were effecting an actual automobile. In this specific case, the value of the simulated mass airflow sensor signal C, for example, may be effected, but the oxygen signal D' will still show zero exhaust oxygen corresponding to a malfunction. These new simulated signals B', C', D' are fed to the electronic automotive system 10 under test and the electronic automotive system 10 is again allowed to react in this case by again issuing an 'reduce injection rate' injection control signal A. This "feedback" loop is allowed to continue through a number of cycles until terminated by the repair technician. Through observation of the behavior of the electronic automotive system 10, reacting to various simulated malfunctions of peripheral components, the repair technician may gain insight into a problem experienced on an actual automobile.

With reference to FIG. 2, there is shown a block diagram of subsystems of another embodiment of a diagnostic system 130 the present invention. The diagnostic system 130 is used for electronically diagnosing an electronic automotive system 10 having a plurality of inputs to be operatively associated with a plurality of peripheral automotive components for receiving operating condition data from the peripheral components and a plurality of outputs to be operatively associated with a plurality of peripheral components.

The diagnostic system 130 is designed to interact with an electronic automotive system 10 of an automobile (such as an ignition timing computer, or a fuel injection control computer, for example) by simulating a properly functioning automobile by simulating input signals (denoted here as In1, In2, In3, In4) normally provided by peripheral components (such as an oxygen sensor or tachometric sensor). As shown, the diagnostic system 130 comprises simulated stimulus input signal generating means 132, output response signal conditioning means 134, exemplar response data signal generating means 136, output evaluator 146, and fault evaluation signal display means 144.

The simulated stimulus input signal generating means 132 generates a plurality of simulated stimulus input signals (for example, IN1, IN2, IN3, IN4) to the electronic automotive system 10 corresponding to actual stimulus signals otherwise normally received by the electronic automotive system 10 from the various peripheral components and causing the electronic automotive system 10 to generate output response signals (for example, Out1, Out1, Out3) based upon the stimulated stimulus input signals (In1, In2, In3, In4). The simulated stimulus signals (In1, In2, In3, In4) can correspond to those input signals which would be created by properly functioning peripheral components. The simulated signal generating means 132 includes a simulated signal generator 132A operatively associated with the inputs of the electronic automotive system 10 under test for supplying the simulated stimulus input signals (In1, In2, In3, In4) to the electronic automotive system 10, and simulated program means 132B operatively associated with the simulated signal generator 132A for controlling the simulated signal generator 132A to produce specific stimulus input signals corresponding to parameters of the program means 132B. The simulation program means 132B contains a plurality of operating parameters corresponding to various operating conditions normally encountered by the electronic automotive system 10 and sequentially controls the simulated signal generator 132A based upon the various operating parameters so that the simulated signal generator 132A generates a sequential plurality of different values for each simulated stimulus input signals (In1, In2, In3, In4) to simulate a plurality of operating conditions.

The output response signal conditioning means, or output signal reader 134 receives the output response signals (Out1, Out2, Out3, Out4) from the electronic automotive system 10 and conditions the output response signals (Out1, Out2, Out3, Out4) for data processing and generating conditioned output signals (for example, Cond1, Cond2, Cond3). The output response signal conditioning means 134 then conditions (regulates the voltages and currents to values suitable for data processing, digitizes analog signals, etc.) and organizes (separates multiplexed signals, if needed, for example) the output response signals Out1, Out2, Out3 for analysis.

The exemplar response data signal generating means 136 is responsive to the simulated stimulus input signals (In1, In2, In3, In4) and generates exemplar response data signals (Resp). The exemplar response data signal generating means 136 can be a functional component of the simulated program means 132B.

The output evaluator 146 receives the conditional output response signals (Cond1, Cond2, Cond3) from the output signal reader 134 and receives the exemplar response signals from the exemplar response data signal generating means 136, and compares them to determine any differences therebetween. The output evaluator 146 evaluates the differences between the conditioned output response signals and the exemplar response signals and generates fault evaluation signals identifying faults in the electronic automotive system 10 corresponding to a difference between the conditioned output response signals and the exemplar signals (i.e. the fault evaluation signal).

The fault evaluation signal display means 144 receives the fault evaluation signal and displays the fault evaluation signal so that it can be read by a repair technician conducting a test.

The simulated input signals In1, In2, In3 and In4 created by a simulated signal generator 132A are controlled by simulation program means 132B. The simulated program means 132B determines the values to be represented by the signals In1, In2, In3, and In4 so that the values of the signals In1 through In4 correspond with those values that would be created by a properly functioning automobile. The simulated input signals In1, In2, In3, and In4 are received by the electronic automotive system 10 under test and the electronic automotive system 10 is allowed to react to the simulated input signals In1, In2, In3 and In4 as it would to actual signals provided by the various peripheral components of an actual automobile. The electronic automotive system 10 responds to the simulated input signals In1, In2, In3, In4 by creating output signals (Out1, Out1 and Out3) that would, if the electronic automotive system 10 were installed in an automobile, control the functioning of peripheral components such as an induction system choke or ignition spark advance, for example. During testing of the electronic automotive system 10 by the diagnostic system 130, however, the output signals Out1, Out2 and Out3 are sent to an output signal reader 134. The output signal reader 134 conditions the output signals Out1, Out2, Out3 for data processing (digitizes analog signals, etc.) and sends the conditioned signals (denoted here as Cond1, Cond2, and Cond3) to the output evaluator 146. The output evaluator 146 compares each of the values represented by the conditioned output signals Cond1, Cond2, Cond3 to predetermined ranges of values corresponding to a properly functioning electronic automotive system 10. If any conditioned output signal (Cond1, Cond2, or Cond3) falls outside the associated predefined range of values to which it is being compared, then the output evaluator 146 sends fault identification data to the evaluation signal display means 144 showing that there is a fault in the electronic automotive system 10 (indicating which value was out of range). If none of the conditioned output signals (Cond1, Cond2 and Cond3) falls outside the associated predefined range of values to which each is being compared, then the output evaluator 146 sends data to the fault evaluation display means 144 showing that there is no fault in the electronic automotive system 10 under test.

With reference to FIG. 3, there is shown a block diagram of sub-systems of yet another embodiment of a diagnostic system 230 of the present invention. The diagnostic system 230 is used for electronically diagnosing an electronic automotive system 10 having a plurality of inputs to be operatively associated with a plurality of peripheral automotive components for receiving operating condition data from the peripheral components and a plurality of outputs to be operatively associated with a plurality of peripheral components. The diagnostic system 230 is designed to interact with the electronic automotive system 10 of an automobile (such as an ignition timing computer, or a fuel-injection control computer, and the like) by simulating a properly functioning automobile by simulating input signals (denoted here as In1, In2, In3, In4) otherwise usually provided by peripheral components (such as an oxygen sensor or tachometric sensor and the like).

As shown, the diagnostic system 230 comprises simulated stimulus input signal generating means 232, output response signal conditioning means 234 exemplar response data signal generating means 236, output evaluator 246, fault evaluation signal display means 244, feedback control loop 248, and program storage means 250.

The simulated stimulus input signal generating means 232 generates a plurality of simulated stimulus input signals (for example, IN1, In2, In3, In4) to the electronic automotive system 10 corresponding to actual stimulus signals otherwise normally received by the electronic automotive system 10 from the various peripheral components and causing the electronic automotive system 10 to generate output response signals (for example, Out1, Out2, Out3) based upon the simulated stimulus input signals (In1, In2, In3, In4). The simulated stimulus signals (In1, In2, In3, In4) can correspond to those input signals which would be created by properly functioning peripheral components. The simulated signal generating means 232 includes a simulated signal generator 232A operatively associated with the inputs of the electronic automotive system 10 under test for supplying the simulated stimulus input signals (In1, In2, In3, In4) to the electronic automotive system 10, and simulated program means 232B operatively associated with the simulated signal generator 232A for controlling the simulated signal generator 232A to produce specific stimulus input signals corresponding to parameters of the program means 232B. The simulation program means 232B contains a plurality of operating parameters corresponding to various operating conditions normally encountered by the electronic automotive system 10 and sequentially controls the simulated signal generator 232A based upon the various operating parameters so that the simulated signal generator 232A generates a sequential plurality of different values for each simulated stimulus input signals (In1, In2, In3, In4) to simulate a plurality of operating conditions.

The output response signal conditioning means, or output signal reader 234 receives the output response signals (Out1, Out2, Out3) from the electronic automotive system 10 and conditions the output response signals (Out1, Out2, Out3) for data processing and generating conditioned output signals (for example, Cond1, Cond2, Cond3). The output response signal conditioning means 234 then conditions (regulates the voltages and currents to values suitable for data processing, digitizes analog signals, etc.) and organizes (separates multiplexed signals, if needed, for example) the output response signals Out1, Out2 and Out3 for analysis.

The exemplar response data signal generating means 236 is responsive to the simulated stimulus input signals (In1, In2, In3, In4) and generates exemplar response data signals (Resp.) which is received by the output evaluator 246. The exemplar response data signal generating means 236 can be a functional component of the simulated program means 232B.

The feedback control loop 248 operatively interconnects the signal conditioning means 234 and the simulated program means 232B for routing conditioned output response signals (Cond1, Cond2, Cond3) from the signal conditioning means 234 to the simulated program means 232B whereby the simulated program means 232B alters the simulated stimulus input signal (In1, In2, In3, In4) generated by the simulated signal generator 232B in accordance with the conditioned output response signal (Cond1, Cond2, Cond3) providing dynamic interaction of the electronic automotive system 10 with the simulated stimulus signal generating means 232A. Further, a feedback loop control 252 is operatively included in the feedback loop 248 and operatively associated with the simulated program means 232B for receiving actuation signals from the simulated program means 232B to open and close the feedback loop 248.

A switching matrix 254 is operatively associated with the electronic automotive system 10 for routing simulated stimulus input signals (In1, In2, In3, In4) to the proper inputs of the electronic automotive system 10. The switching matrix 254 is also operatively associated with the conditioning means 234 for routing the output signal response signals from the electronic automotive system 10 to the proper inputs of the conditioning means 234.

The program storage means 250 has a plurality of sets of performance specifications appropriate to different electronic automotive systems 10 to be tested, and statistical fault information storage capacity for empirically gathered storing data or typical faults and the causes thereof. The program storage means 250 is operatively associated with the simulated program means 232B for providing the simulated program means 232B with performance specifications appropriate to the particular electronic automotive system 10 being tested. The program storage means 250 is also operatively associated with the output evaluator 246 for supplying the appropriate statistical fault information signal to the output evaluator 246, whereby the output evaluator 246 compares the fault evaluation signals to the statistical fault information and identifies probable cause for an identified fault in the electronic automotive system 10. Still further, the program storage means 250 is also operatively associated with the output evaluator 246 for receiving fault evaluation signals from the output evaluator 246, and updating the statistical fault information stored in the fault information storage capacity of the program storage means 250. The program storage means 250 also includes switching matrix configuration data appropriate to different electronic automotive systems 10 to be tested. The program storage means 250 provides the simulated program means with switching matrix configuration data appropriate to the particular electronic automotive system 10 under test so that the simulated program means will generate a routing signal to the switching matrix 254 corresponding to the particular electronic automotive system 10 being tested.

The program storage means 250 also has a simulation vehicle identification sub-program associated with each set of the plurality of performance specifications which is functionally interchangeable with a vehicle identification program (stored usually in a prom type semi-conductor chip) that defines into what type of vehicle (make, model, and year) the electronic automotive system 10 is to be installed. This vehicle identification program allows a single model of electronic automotive system 10 to be used for many applications by supplying to the electronic automotive system 10, specifications relating to appropriate actions to be taken by the electronic automotive system 10 based on vehicle specifications (engine size, the presence of an air conditioning unit, etc.). The simulation vehicle identification sub-program supplied by the program storage means 250 obviates the need to have the original vehicle identification program (usually stored in a prom-type, semi-conductor chip) and allows the electronic automotive system 10 to be tested as if it were installed in any type of vehicle simply by changing which simulation vehicle identification sub-program (stored in the program storage means 250) is being used.

A simulation vehicle identification signal 260 is sent from the program storage means 250 to the electronic automotive system 10 under test and functionally replaces the vehicle identification program normally associated with the electronic automotive system 10.

A vehicle identification interface plug 262 communicates the simulation vehicle identification signal 260 from the program storage means 290 to the electronic automotive system 10 under test.

With continued reference to FIG. 3 and additional reference to FIG. 3A, the output evaluator 246 comprises comparing means 238 and evaluating means 240 as operating functions and components. The comparing means 238 is operatively associated with the output signal reader 234 to receive the conditioned output response signals (Cond1, Cond2 Cond3) from the output signal reader 234 and is operatively associated with the exemplar response data signal generating means 236 to receive the exemplar response signals from the exemplar response data signal generating means 236 of the simulated program means 232B, compares them to determine any differences therebetween and generates a fault identification signal. The fault identification signal indicates that an anomaly has occurred and identifies which conditioned output response signal is outside a predetermined range defined by the exemplar response data signal. The fault identification signal is then received by the fault display means 244 which displays the fault identification signal so that it can be read by a repair technician conducting the test. In addition, the comparing means 238 is also operatively associated with the program storage means 250 to send the fault identification signal to the program storage means 250 to update the statistical fault information capacity of the program storage means 250. Also, the evaluating means 240 receives the fault identification signal from the comparing means 238 and receives the statistical fault information signal from the program storage means 250. The evaluating means 240 correlates the fault identification signals to the statistical fault information signal and generates a diagnostic list of probable causes for the identified fault based upon the statistical fault information, and then generates a signal to the display means 244 communicating the diagnostic test to the display means 244 so that it can be read by repair technician.

In operation of the diagnostic system 230, the simulated input signals In1, In2, In3 and In4 are created by a simulated signal generator 232A which is controlled by simulation program means 232B which determines the values to be represented by the signals In1, In2, In3, In4 so that the values of the signals In1, In2, In3, In4 correspond to those values that would be created by a properly functioning automobile. The simulated input signals In1, In2, In3, In4 are received by the electronic automotive system 10 under test and the electronic automotive system is allowed to react to the simulated input signals In1, In2, In3, In4 as it would to actual signals provided by the various peripheral components of an actual automobile. The electronic automotive system 10 responds to the simulated input signals In1, In2, In3, In4 by creating output signals (denoted here as Out1, Out2, Out3) that would, if the electronic automotive system 10 were installed in an automobile, control the functioning of peripheral components such as an induction system choke or ignition spark advance, for example. During testing of the electronic automotive system 10 by the diagnostic system 130, the output signals Out1, Out2, Out3 are sent to an output signal reader 234. The output signal reader 234 conditions the output signals Out1, Out2, Out3 for data processing (digitizes analog signals, etc.) and sends the conditioned signals (denoted here as Cond1, Cond2, and Cond3) to an output evaluator 246. The output evaluator 246 compares each of the values represented by the conditioned output signals Cond1, Cond2, and Cond3 to predetermined ranges of values corresponding to a properly functioning electronic automotive system 10. If any conditioned output signal (Cond1, Cond2, or Cond3) falls outside the associated predefined range of values to which it is being compared, then the output evaluator 246 sends data to diagnostic output means 244 showing that there is a fault and describing the nature of the fault (i.e. which value was out of range). If none of the conditioned output signals (Cond1, Cond2, and Cond3) falls outside the associated predefined range of values to which each is being compared, then the output evaluator 246 sends data to the diagnostic output means 244 showing that there is no fault in the electronic automotive system 10 under test.

It should be understood that the diagnostic system 130 conducts tests of the automotive system 10 under "full load" operating conditions simulating the actual loads and power conditions demanded of the automotive system 10 under operation conditions in an actual automobile.

The foregoing detailed description is given primarily for clearness of understanding and no unnecessary limitations are to be understood therefrom for modifications will become obvious to those skilled in the art upon reading this disclosure and may be made without departing from the scope of the inventions or scope of the appended claims.

What is claimed is:

1. A method for electronically diagnosing an electronic automotive system normally operatively associated with and controlling peripheral components of a motor vehicle comprising:

a. providing an electronic automotive system which is electrically disconnected from an electronic data bus and peripheral components of a motor vehicle:

b. generating simulated stimulus input signals to the electronic automotive system corresponding to actual stimulus signals normally received by the electronic automotive system from the peripheral components and causing the electronic automotive system to generate output response signals based upon the simulated stimulus input signals while said electronic automotive system is disconnected from said data bus and peripheral components;

c. conditioning the output response signals from the electronic automotive system for data processing and generating conditioned output response signals;

d. generating exemplar response data signals responsive to the simulated stimulus input signals;

e. comparing each of the conditioned output response signals to the exemplar response signals;

f. evaluating differences between the conditioned output response signals and the exemplar response signals;

g. if there is a difference between the conditioned output response signals and the exemplar response signals, then generating corresponding fault evaluation signals identifying faults in the electronic automotive system;

h. displaying the fault evaluation signal; and i. altering the generated simulated stimulus input signals in accordance with the conditioned output response signals.

2. The method of claim 1, wherein the step of generating simulated stimulus input signals further comprises sequentially generating simulated stimulus input signals corresponding to various operating conditions normally encountered by the electronic automotive system.

3. The method of claim 1, wherein the step of generating simulated stimulus input signals comprises generating a sequential plurality of different values for each simulated stimulus input signal to simulate a plurality of operating conditions.

4. The method of claim 1, comprising the further steps of routing the simulated stimulus input signal to the proper inputs of the electronic automotive system.

5. The method of claim 1, further comprising the steps of comparing the fault evaluation signals to statistical fault information and identifying probable causes for an identified fault in the electronic automotive system based upon the statistical fault information.

6. The method of claim 1, further comprising the step of compiling the fault evaluation signals to generate statistical fault information.

7. A diagnostic system for electronically diagnosing an electronic automotive system having a plurality of inputs to be operatively associated with a plurality of peripheral components of a motor vehicle for receiving operating condition data from the peripheral components and a plurality of outputs to be operatively associated with a plurality of peripheral components of said vehicle for controlling the peripheral components, the diagnostic system comprising:

a. means for generating a plurality of simulated stimulus input signals and for directing said signals to input terminals of the electronic automotive system corresponding to actual stimulus signals normally received by the electronic automotive system from the peripheral components and causing the electronic automotive system to generate output response signals based upon the simulated stimulus input signals while said electronic automotive system is electrically disconnected from a data bus and from the peripheral components of said motor vehicle;

b. means for conditioning the output response signals from the electronic automotive system for data processing and generating conditioned output signals;

c. means for generating exemplar response data signals responsive to the simulated stimulus input signals;

d. means for comparing each of the conditioned output response signals to the exemplar response signals;

e. means for evaluating differences between the conditioned output response signals and the exemplar response data signals;

f. means for generating fault evaluation signals identifying faults in the electronic automotive system corresponding to a difference between the conditioned output response signals and the exemplar response signals;

g. means for displaying the fault evaluation signal generated by the fault evaluation signal generating means; and h. means for altering the generated stimulated stimulus input signals in accordance with the conditioned output response signals.

8. The diagnostic system of claim 7, wherein the simulated stimulus input signal generating means comprises:

a. a simulated signal generator operatively associated with the inputs of the electronic automotive system under test for supplying the simulated stimulus input signals to the electronic automotive system; and, b. simulation program means operatively associated with the simulated signal generator for controlling the simulated signal generator to produce specific simulated stimulus input signals corresponding to parameters of the program means.

9. The diagnostic system of claim 8, wherein the simulation program means contains a plurality of operating parameters corresponding to various operating conditions normally encountered by the electronic automotive system, and sequentially controls the simulated signal generator based upon the various operating parameters, and generates the exemplar response data signals.

10. The diagnostic system of claim 8, wherein the conditioning means is operatively associated with the electronic automotive system for receiving the output response signals.

11. The diagnostic system of claim 8, wherein the comparing means is operatively associated with the conditioning means for receiving the conditioned output response signals and operatively associated with the exemplar response data signal generating means for receiving the exemplar response data signals.

12. The diagnostic system of claim 8, wherein the displaying means is operatively associated with the comparing means for receiving the fault evaluation signal from the fault evaluation signal generating means and displays an identification of the fault.

13. The diagnostic system of claim 8, wherein the simulated stimulus input signal generating means generates a sequential plurality of different values for each simulated stimulus input signal to simulate a plurality of operating conditions.

14. The diagnostic system of claim 8, further comprising a switching matrix for routing simulated stimulus input signals to the proper inputs of the electronic automotive system, and for routing the output signal response signals from the electronic automotive system to the proper inputs of the conditioning means.

15. The diagnostic system of claim 14, wherein the simulated program means is operatively associated with the switching matrix for generating a routing signal to the switching matrix for controlling the routing of the simulated input signals and the routing of the output response signals.

16. The diagnostic system of claim 15, further comprising program storage means having a plurality of sets of performance specifications and switching matrix configuration data appropriate to different electronic automotive systems to be tested, the program storage means being operatively associated with the simulated program means for providing the simulated program means with switching matrix configuration data so that the simulated program means will generate a routing signal to the switching matrix corresponding to the particular electronic automotive system being tested.

17. The diagnostic system of claim 8, further comprising:

a. a feedback loop operatively interconnecting the signal conditioning means and the simulated program means for routing conditioned output response signals from the signal conditioning means to the simulated program means whereby the simulated program means alters the simulated stimulus input signal generated by the simulated signal generator in accordance with the conditioned output response signals providing dynamic interaction of the electronic automotive system with the simulated stimulus signal generating means; and, b. a feedback loop control in the feedback loop and operatively associated with the simulated program means for receiving actuation signals from the simulated program means.

18. The diagnostic system of claim 8, further comprising program storage means having a plurality of sets of performance specifications appropriate to different electronic automotive systems to be tested operatively associated with the simulated program means for providing the simulated program means with performance specifications appropriate to the particular electronic automotive system being tested.

19. The diagnostic system of claim 18, wherein the program storage means further has statistical fault information storage capacity and is operatively associated with the evaluating means for supplying the appropriate statistical fault information to the evaluating means, whereby the evaluating means compares the fault evaluation signals to the statistical fault information and identifies probable cause for an identified fault in the electronic automotive system.

20. The diagnostic system of claim 19, wherein the program storage means is also operatively associated with the evaluating means for receiving fault evaluation signals from the evaluating means updating the statistical fault information stored in the program storage means.

21. The diagnostic system of claim 18, wherein:
   a. the program storage means is located remote from the simulated program means; and
   b. the operative association between the programs storage means and the simulated program means comprises remote communication means.

22. The diagnostic system of claim 8 wherein the simulation means further comprises a simulation vehicle identification sub-program for replacing a vehicle identification program conventionally installed in the electronic automotive system under test.

23. A diagnostic system for electronically diagnosing an electronic automotive system having a plurality of inputs to be operatively associated with a plurality of peripheral components of a motor vehicle for receiving operating condition data from the peripheral components and a plurality of outputs to be operatively associated with a plurality of peripheral components of said vehicle for controlling the peripheral components, the diagnostic system comprising:
   a. means for generating a plurality of simulated stimulus input signals and for directing said signals to input terminals of the electronic automotive system corresponding to actual stimulus signals normally received by the electronic automotive system from the peripheral components and causing the electronic automotive system to generate output response signals based upon the simulated stimulus input signals while said electronic automotive system is electrically disconnected from a data bus and from the peripheral components of said motor vehicle; said simulated stimulus input signal generating means including:
      1. a simulated signal generator operatively associated with the inputs of the electronic automotive system under test for supplying the simulated stimulus input signals to the electronic automotive system; and
      2. simulation program means operatively associated with the simulated signal generator for controlling the simulated signal generator to produce specific simulated stimulus input signals corresponding to parameters of the program means;
   b. means for conditioning the output response signals from the electronic automotive system for data processing and generating conditioned output signals;
   c. means for generating exemplar response data signals responsive to the simulated stimulus input signals;
   d. means for comparing each of the conditioned output response signals to the exemplar response signals;
   e. means for evaluating differences between the conditioned output response signals and the exemplar response data signals;
   f. means for generating fault evaluation signals identifying faults in the electronic automotive system corresponding to a difference between the conditioned output response signals and the exemplar response signals;
   g. means for displaying the fault evaluation signal generated by the fault evaluation signal generating means:
   h. a feedback loop operatively interconnecting the signal conditioning means and the simulated program means for routing conditioned output response signals from the signal conditioning means to the simulated program means whereby the simulated program means alters the simulated stimulus input signal generated by the simulated signal generator in accordance with the conditioned output response signals providing dynamic interaction of the electronic automotive system with the simulated stimulus signal generating means; and,
   i. a feedback loop control in the feedback loop and operatively associated with the simulated program means for receiving actuation signals from the simulated program means.

* * * * *